United States Patent
Kesavaperumal et al.

(10) Patent No.: US 10,477,721 B2
(45) Date of Patent: Nov. 12, 2019

(54) MECHANISM TO PROVIDE PHYSICAL LOCATION INFORMATION TO ANY NETWORK DEVICE

(71) Applicant: Juniper Networks, Inc., Sunnyvale, CA (US)

(72) Inventors: Balakrishnan Kesavaperumal, Bangalore (IN); Vaibhav Jain, Bangalore (IN); Srinivas Jayaram, Bangalore (IN); Sunit Ramesh Rajhans, Bangalore (IN)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 15/196,272

(22) Filed: Jun. 29, 2016

(65) Prior Publication Data

US 2018/0007809 A1 Jan. 4, 2018

(51) Int. Cl.
| | |
|---|---|
| *H05K 7/18* | (2006.01) |
| *H04B 5/00* | (2006.01) |
| *H04L 29/08* | (2006.01) |
| *H05K 7/14* | (2006.01) |
| *G06Q 10/08* | (2012.01) |

(52) U.S. Cl.
CPC .......... *H05K 7/183* (2013.01); *G06Q 10/087* (2013.01); *H04B 5/0062* (2013.01); *H04L 67/18* (2013.01); *H05K 7/1401* (2013.01); *H05K 7/1422* (2013.01); *H05K 7/1498* (2013.01); *H05K 7/186* (2013.01)

(58) Field of Classification Search
CPC .... H05K 7/183; H05K 7/1401; H05K 7/1422; H05K 7/186; H05K 7/1498; H04B 5/0062; H04L 67/18; G06Q 10/087
See application file for complete search history.

(56) References Cited

U.S. PATENT DOCUMENTS

| | | | |
|---|---|---|---|
| 6,768,643 B1 * | 7/2004 | Rust | G06F 1/183 361/732 |
| 7,291,032 B1 * | 11/2007 | Carver | H01R 43/26 439/310 |
| 7,652,889 B2 | 1/2010 | Larson et al. | |
| 8,659,395 B2 * | 2/2014 | Kilian | G06K 7/10178 340/10.1 |
| 8,755,191 B2 * | 6/2014 | Riebel | H05K 7/1488 361/679.38 |

(Continued)

OTHER PUBLICATIONS

Extended European Search Report for European Application No. 16194023.4; dated Mar. 1, 2017, 12 pages.

(Continued)

*Primary Examiner* — Hoa C Nguyen
*Assistant Examiner* — Christopher L Augustin
(74) *Attorney, Agent, or Firm* — Harrity & Harrity, LLP

(57) ABSTRACT

An apparatus may be configured to be mounted on a rack. The apparatus may include a communication component. The communication component may be used for communicating with a network device when the network device is mounted on the rack. The apparatus may include a storage device. The storage device may be used for storing information to be provided to the network device, via the communication component, when the network device is mounted on the rack.

21 Claims, 12 Drawing Sheets

(56) References Cited

U.S. PATENT DOCUMENTS

| | | | | |
|---|---|---|---|---|
| 8,917,513 B1* | 12/2014 | Hazzard | ............... | H05K 7/1498 |
| | | | | 211/153 |
| 9,066,441 B2* | 6/2015 | Kilian | ................... | H05K 7/1489 |
| 9,456,522 B2* | 9/2016 | Aimone | ............... | G06Q 10/087 |
| 9,582,450 B2* | 2/2017 | Luck | ........................ | G06F 1/181 |
| 2009/0195363 A1 | 8/2009 | Downie et al. | | |
| 2011/0051341 A1* | 3/2011 | Baldassano | .......... | G02B 6/4452 |
| | | | | 361/679.02 |
| 2012/0024955 A1* | 2/2012 | Muhsam | .............. | H05K 7/1498 |
| | | | | 235/462.01 |
| 2015/0319879 A1* | 11/2015 | Aimone | ............... | H05K 7/1498 |
| | | | | 235/375 |
| 2016/0234960 A1* | 8/2016 | Masuyama | .......... | H05K 7/1498 |
| 2018/0114106 A1* | 4/2018 | Pheil | ...................... | H04B 1/385 |

OTHER PUBLICATIONS

Wikipedia, "19-inch rack," https://en.wikipedia.org/wiki/19-inch_rack, May 31, 2016, 10 pages.

\* cited by examiner

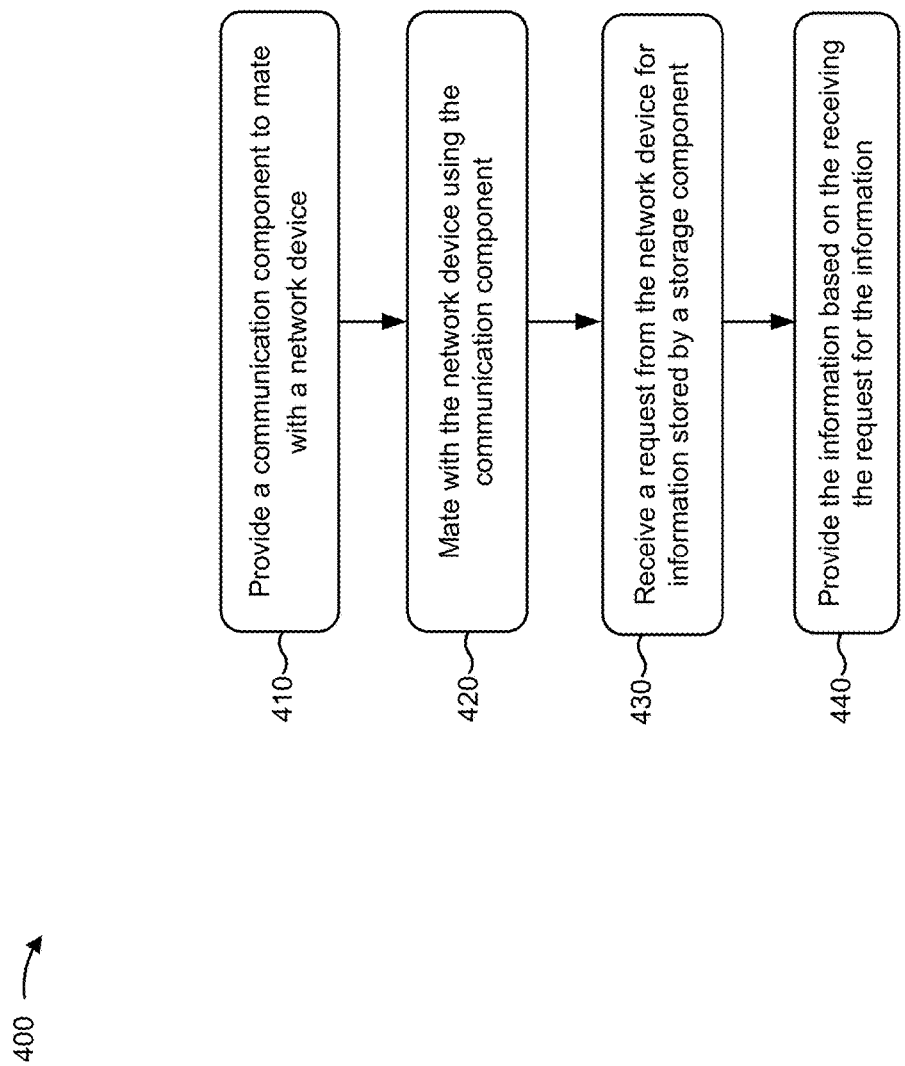

MECHANISM TO PROVIDE PHYSICAL LOCATION INFORMATION TO ANY NETWORK DEVICE

BACKGROUND

A rack may include a standardized frame for mounting equipment, such as a network device. For example, the equipment may be mounted on a rack post of the rack by bolting or clipping the equipment to mounting rails of the rack. The rack may be divided vertically into rack units. The vertical height of the equipment may be defined as a quantity of rack units.

SUMMARY

According to some possible implementations, a rack may include a hardware module mounted on the rack. The hardware module may include a storage device that stores information to be transmitted to a network device when the network device is mounted on the rack. The hardware module may include a communication component that permits the information to be communicated from the storage device to the network device when the network device is mounted on the rack.

According to some possible implementations, a hardware module may be configured to be mounted on a rack. The hardware module may include a communication component capable of mating the hardware module to a network device when the network device is mounted on the rack. The hardware module may include a storage device connected to the communication component. The storage device may store information to be transmitted to the network device, via the communication component, when the network device is mounted on the rack.

According to some possible implementations, an apparatus may be configured to be mounted on a rack. The apparatus may include a communication component for communicating with a network device when the network device is mounted on the rack. The apparatus may include a storage device for storing information to be provided to the network device, via the communication component, when the network device is mounted on the rack.

BRIEF DESCRIPTION OF THE DRAWINGS

FIG. 4 is a flow chart of an example process for providing information to a network device using a set of components mounted on a rack;

DETAILED DESCRIPTION

The following detailed description of example implementations refers to the accompanying drawings. The same reference numbers in different drawings may identify the same or similar elements.

A network device may be associated with a location (e.g., a physical location) where the network device is located or installed, such as a country, a state, a city, a building, a floor, or a rack. Such information may be useful for locating the network device, such as when work is to be performed on the network device (e.g., to move the network device from one location to another, to modify a configuration of the network device, to remove or replace the network device, etc.). In some cases, the network device may receive this information based on input provided via a network administrator (e.g., via manual entry by the network administrator or by the network administrator scanning a barcode, a quick response (QR) code, an optical storage device, etc.). This may require human involvement and may be labor intensive and/or time consuming. Further, this may require reprogramming the network device with new information when the network device is moved. In other cases, the network device may not receive this information.

Implementations described herein enable a rack to be configured to enable a network device to automatically receive information, such as information associated with identifying a location of the network device, upon being mounted on the rack. This improves an efficiency of the network device by reducing or eliminating the need for the network device to wait to receive the information (e.g., from a network administrator). In addition, this reduces or eliminates the need for human involvement in configuring the network device with the information by, for example, reducing or eliminating the need for the network administrator to manually configure the network device with the information.

Further, automatically providing information that identifies the location of the network device improves management (e.g., inventory management or configuration management) of network devices by enabling the network device to obtain accurate location information when the network device is moved from one location to another, is replaced by another network device, or is removed from a location. Further, obtaining accurate location information enables a network administrator to generate an accurate network topology using the location information, thereby improving management of a network.

Figure 1:
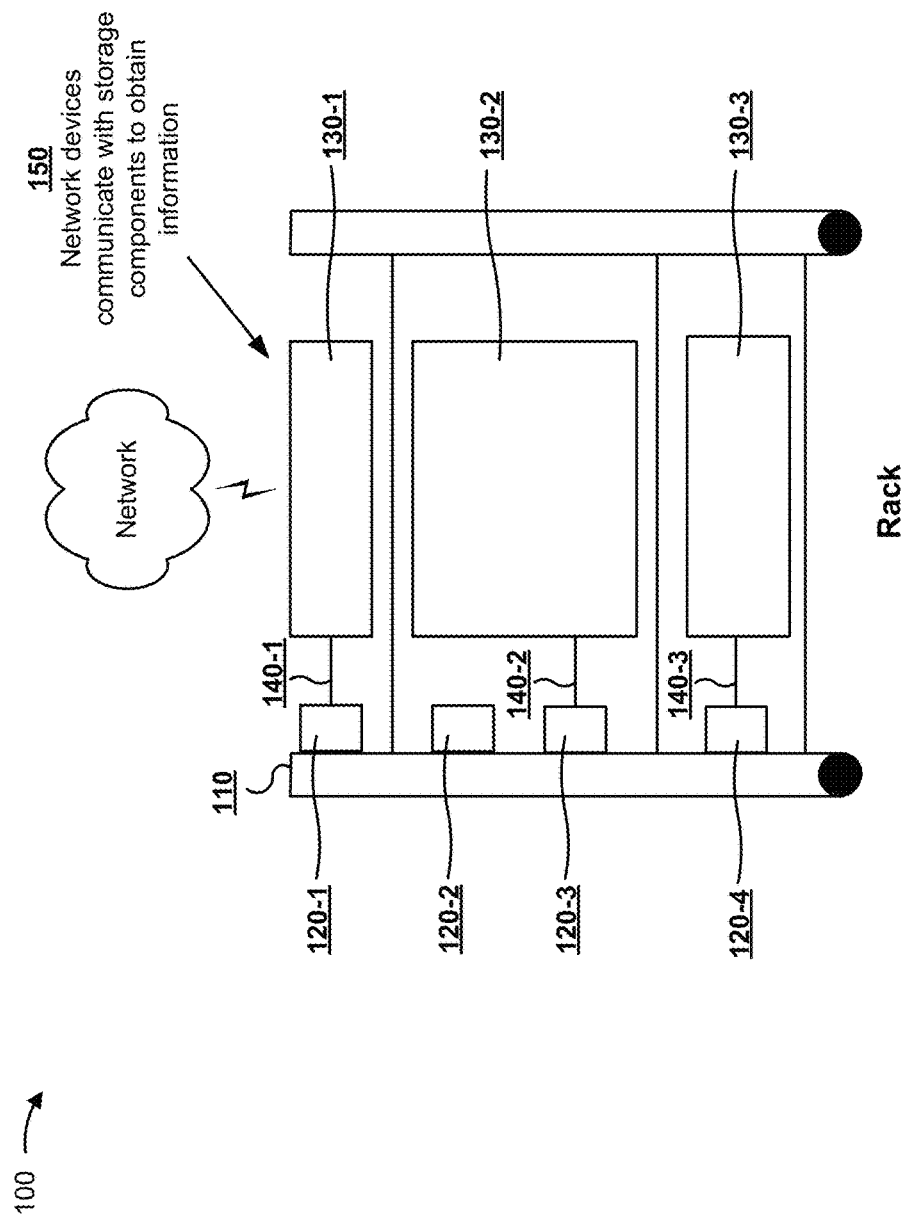
FIG. 1 is a diagram of an overview of an example implementation described herein.

FIG. 1 is a diagram of an overview of an example implementation 100 described herein. As shown in FIG. 1, a rack may be used to mount network devices. As further shown in FIG. 1, the rack may include a rack post 110, on which components and/or devices may be mounted (e.g., by a network administrator). As further shown in FIG. 1, assume, for example, that storage devices 120-1 through 120-4 have been mounted on the rack. Storage devices 120 may be mounted on rack post 110 of the rack according to a standard interval (e.g., one storage device per rack unit or one storage device per two rack units). Storage devices 120 may be mounted on any one of multiple rack posts 110. In addition, each storage device 120 may store information, such as information identifying a physical location of the particular storage device 120, which network devices 130 may use, as described in more detail elsewhere herein.

As further shown by FIG. 1, assume, for example, that network devices 130-1 through 130-3 have been mounted on rack post 110. As further shown by FIG. 1, network devices 130 may be connected to storage devices 120 via connections 140-1 through 140-3 when network devices 130 are mounted on rack post 110. For example, when mounted on rack post 110, network device 130-1 may connect to storage device 120-1, network device 130-2 may connect to storage device 120-3, and so forth. This enables network devices 130 to automatically obtain information from storage devices 120 when mounted on rack post 110, thereby increasing an efficiency of providing the information to network devices 130.

As further shown in FIG. 1, each network device 130 may be connected to a single storage device 120 (e.g., regardless of a size of network device 130). For example, assume that the rack includes one storage device 120 per rack unit. Further assume, for example, that network device 130-2 has a multi-rack unit size. As shown by FIG. 1, network device 130-2 may be connected to a single storage device 120 (e.g., storage device 120-3) despite network device 130-2 having a size that would permit connection with either storage device 120-2 or 120-3. Although network device 130-2 is shown as a two rack unit network device, network device 130-2 may include another multiple rack unit network device, such as a three rack unit network device, a four rack unit network device, etc. As shown by reference number 150, network devices 130 may communicate with storage devices 120. For example, network devices 130 may communicate with storage devices 120 to obtain information stored by storage devices 120 (e.g., information associated with identifying a physical location of network devices 130).

In this way, components of a rack may be configured to connect a network device with a storage device that stores information associated with the network device. This enables the network device to automatically and efficiently obtain the information stored by the storage device, thereby conserving computing resources that would be used to configure the network device (e.g., during manual configuration by a network administrator). In addition, this increases an efficiency of configuring the network device by reducing or eliminating the efforts of, or need for, a network administrator to configure the network device with the information. Further, providing information that identifies the location of the network device improves management of the network devices (e.g., inventory management or configuration management) by enabling the network device to obtain accurate location information when the network device is moved from one location to another, is replaced by another network device, or is removed from a location.

As indicated above, FIG. 1 is provided merely as an example. Other examples are possible and may differ from what was described with regard to FIG. 1.

Figure 2:
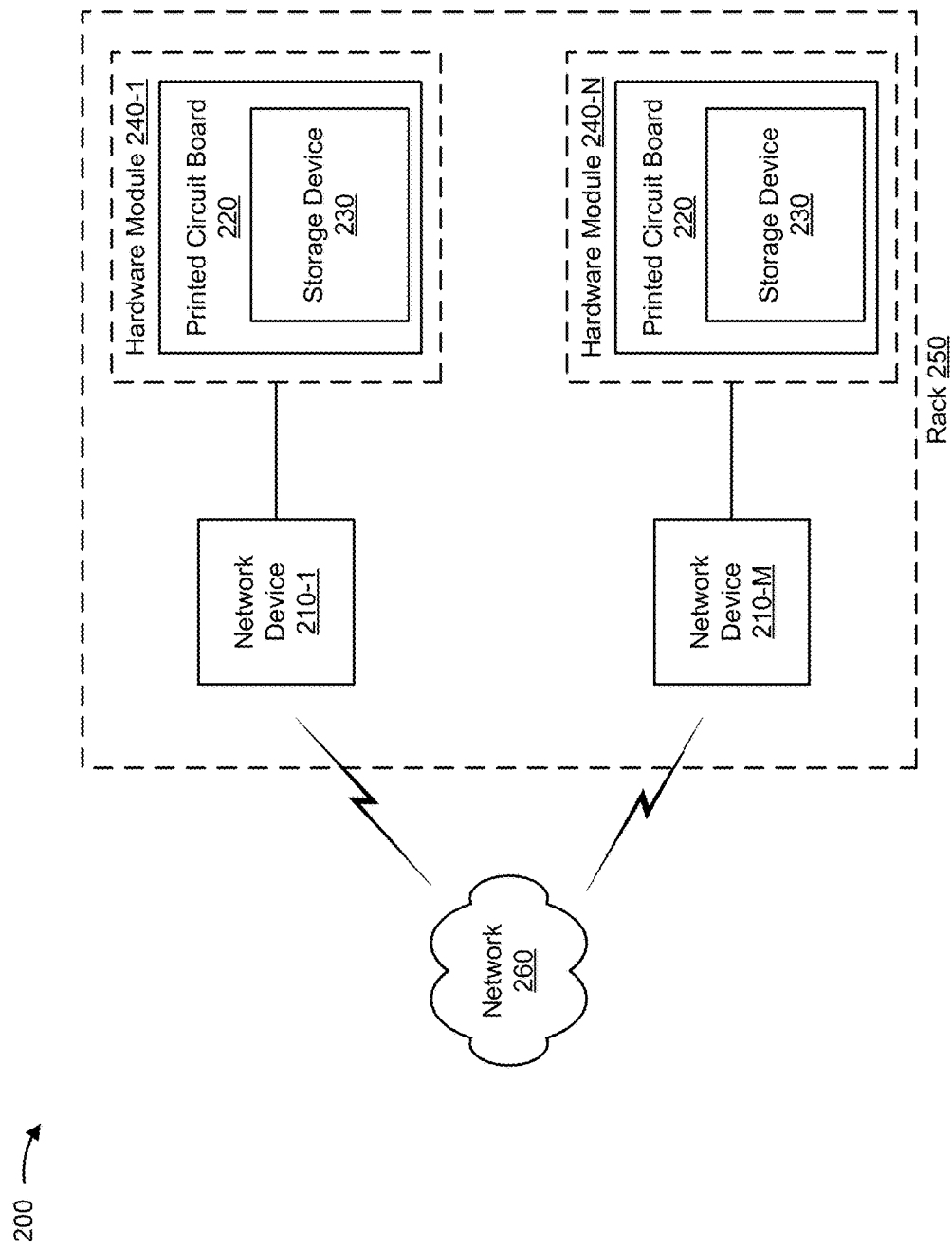
FIG. 2 is a diagram of an example configuration of a rack described herein.

FIG. 2 is a diagram of an example environment 200 in which systems and/or methods, described herein, may be implemented. As shown in FIG. 2, environment 200 may include one or more network devices 210-1 through 210-M (M≥1) (hereinafter referred to collectively as "network devices 210," and individually as "network device 210"), a printed circuit board 220, a storage device 230, one or more hardware modules 240-1 through 240-N (N≥1) (hereinafter referred to collectively as "hardware modules 240," and individually as "hardware module 240"), a rack 250, and a network 260. Devices of environment 200 may interconnect via wired connections, wireless connections, or a combination of wired and wireless connections.

Network device 210 includes one or more devices capable of receiving, storing, generating, and/or processing information, such as information identifying a physical location of storage device 230 and/or rack 250 (e.g., a country, a state, a city, a building, a floor, a room, an aisle, a rack, a position on a rack, etc.). For example, network device 210 may include a switch, a server (e.g., a proxy server, a web server, a host server, a storage server, a server in a data center or cloud computing environment, etc.), a router, a firewall, a gateway, a hub, a bridge, a reverse proxy, a security device, an intrusion detection device, a load balancer, or a similar device. In some implementations, network device 210 may be mounted on rack 250, as described in more detail elsewhere herein. In some implementations, network device 210 may communicate with storage device 230 to obtain information from storage device 230, as described in more detail elsewhere herein.

Printed circuit board 220 includes one or more components capable of mechanically supporting and/or electrically connecting other components (e.g., electronic components of network device 210 and/or hardware module 240). For example, printed circuit board 220 may include a circuit board, a motherboard, a single-sided printed circuit board, a double-sided printed circuit board, or a multi-layer printed circuit board. In some implementations, printed circuit board 220 may enable communication between one or more components of network device 210 and/or hardware module 240. For example, printed circuit board 220 may connect network device 210 and storage device 230, as described in more detail elsewhere herein.

Storage device 230 includes one or more components capable of receiving, generating, storing, processing, and/or providing information, such as information identifying a physical location of storage device 230 and/or rack 250 (e.g., a building, a floor, a room, an aisle, a rack, a position on a rack, etc.). For example, storage device 230 may include an erasable programmable read-only memory (EPROM) component, an electrically erasable programmable read-only memory (EEPROM) component, a flash memory component, an optical disc, a magnetic tape, a physical storage device, an optical storage device, and/or a similar type of dynamic or static storage device. As another example, storage device 230 may include a radio-frequency identification (RFID) tag, a barcode tag, a QR code tag, and/or a similar type of machine-readable tag. In some implementations, storage device 230 may provide information, or make information available, to network device 210, as described in more detail elsewhere herein.

Hardware module 240 includes a collection of one or more components. For example, hardware module 240 may include printed circuit board 220 and/or storage device 230. In some implementations, hardware module 240 may be mounted on rack 250, as described in more detail elsewhere herein. In some implementations, hardware module 240 may be used to provide information to network device 210 (e.g., when network device 210 is mounted on rack 250), as described in more detail elsewhere herein.

Rack 250 includes a physical structure, a frame, or an enclosure capable of physically supporting one or more network devices via mounting (e.g., using fasteners). For example, rack 250 may include a 19-inch rack, a 23-inch rack, a server rack, a server cabinet, or a similar type of structure, frame, or enclosure. In some implementations, a network administrator may mount network device 210 on rack 250, as described in more detail elsewhere herein. Additionally, or alternatively, the network administrator may mount hardware module 240 on rack 250, as described in more detail elsewhere herein.

Network 260 includes one or more wired and/or wireless networks. For example, network 260 may include a cellular network (e.g., a long-term evolution (LTE) network, a 3G network, or a code division multiple access (CDMA) network), a public land mobile network (PLMN), a local area network (LAN), a wide area network (WAN), a metropolitan area network (MAN), a telephone network (e.g., a Public Switched Telephone Network (PSTN)), a private network, an ad hoc network, an intranet, the Internet, a fiber opticbased network, a cloud computing network, or the like, and/or a combination of these or other types of networks.

The number and arrangement of components and networks shown in FIG. 2 are provided as an example. In practice, there may be additional components and/or networks, fewer components and/or networks, different components and/or networks, or differently arranged components and/or networks than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) of environment 200 may perform one or more functions described as being performed by another set of components of environment 200.

Figure 3:
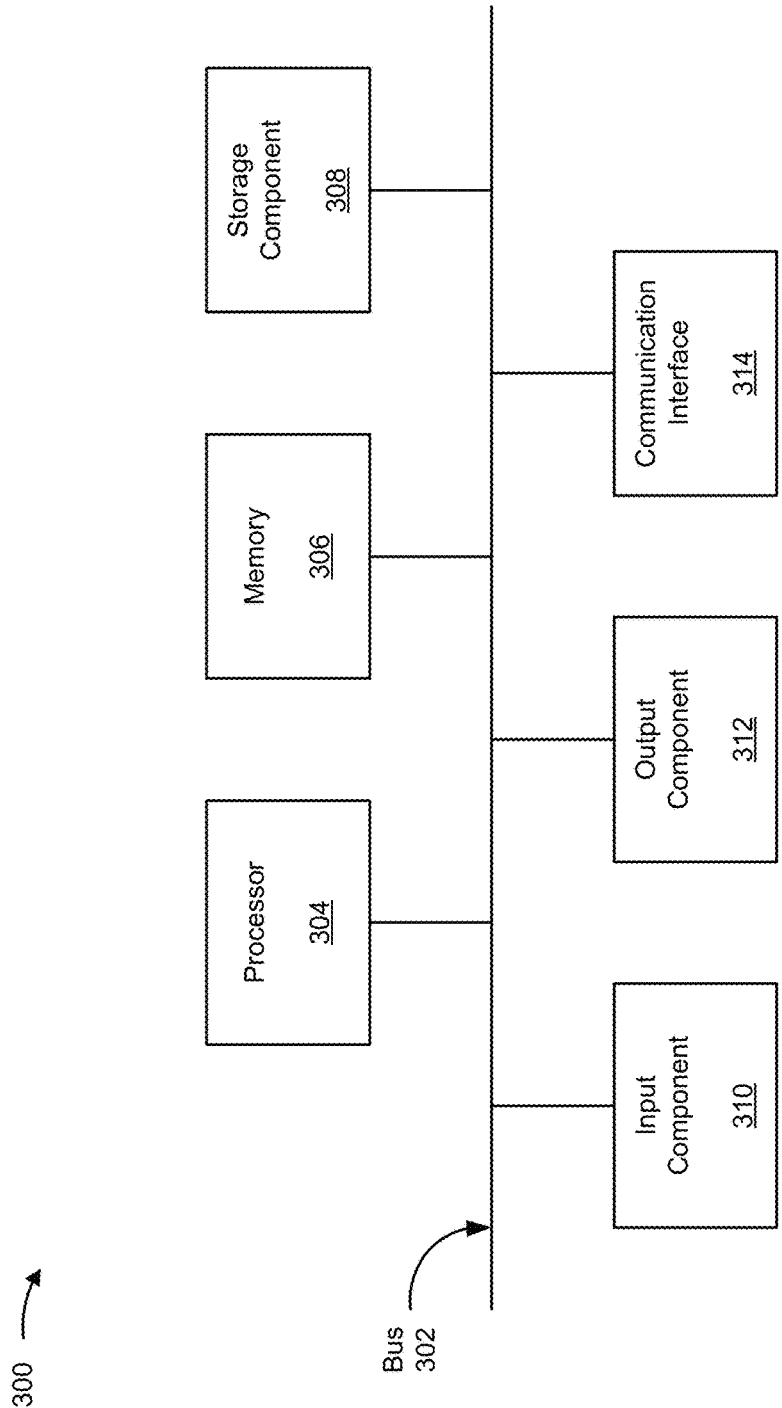
FIG. 3 is a diagram of example components of one or more devices of FIG. 2.

FIG. 3 is a diagram of example components of a device 300. Device 300 may correspond to network device 210, printed circuit board 220, storage device 230, and/or hardware module 240. In some implementations, network device 210, printed circuit board 220, storage device 230, and/or hardware module 240 may include one or more devices 300 and/or one or more components of device 300. As shown in FIG. 3, device 300 may include a bus 302, a processor 304, a memory 306, a storage component 308, an input component 310, an output component 312, and a communication interface 314.

Bus 302 includes a component that permits communication among the components of device 300. Processor 304 is implemented in hardware, firmware, or a combination of hardware and software. Processor 304 includes a processor (e.g., a central processing unit (CPU), a graphics processing unit (GPU), and/or an accelerated processing unit (APU)), a microprocessor, a microcontroller, and/or any processing component (e.g., a field-programmable gate array (FPGA) and/or an application-specific integrated circuit (ASIC)) that interprets and/or executes instructions. In some implementations, processor 304 includes one or more processors capable of being programmed to perform a function. Memory 306 includes any random access memory (RAM), any read only memory (ROM), and/or another type of dynamic or static storage device (e.g., a flash memory, a magnetic memory, and/or an optical memory) that stores information and/or instructions for use by processor 304.

Storage component 308 stores information and/or software related to the operation and use of device 300. For example, storage component 308 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 310 includes a component that permits device 300 to receive information, such as via user input (e.g., a touch screen display, a keyboard, a keypad, a mouse, a button, a switch, and/or a microphone). Additionally, or alternatively, input component 310 may include a sensor for sensing information (e.g., a global positioning system (GPS) component, an accelerometer, a gyroscope, and/or an actuator). Output component 312 includes a component that provides output information from device 300 (e.g., a display, a speaker, and/or one or more light-emitting diodes (LEDs)).

Communication interface 314 includes a transceiver-like component (e.g., a transceiver and/or a separate receiver and transmitter) that enables device 300 to communicate with other devices, such as via a wired connection, a wireless connection, or a combination of wired and wireless connections. Communication interface 314 may permit device 300 to receive information from another device and/or provide information to another device. For example, communication interface 314 may include an Ethernet interface, an optical interface, a coaxial interface, an infrared interface, a radio frequency (RF) interface, a universal serial bus (USB) interface, a Wi-Fi interface, a cellular network interface, a serial interface (e.g., a universal asynchronous receiver/transmitter (UART)), or the like.

Device 300 may perform one or more processes described herein. Device 300 may perform these processes in response to processor 304 executing software instructions stored by a non-transitory computer-readable medium, such as memory 306 and/or storage component 308. A computer-readable medium is defined herein as a non-transitory memory device. A memory device includes memory space within a single physical storage device or memory space spread across multiple physical storage devices.

Software instructions may be read into memory 306 and/or storage component 308 from another computer-readable medium or from another device via communication interface 314. When executed, software instructions stored in memory 306 and/or storage component 308 may cause processor 304 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

FIG. 4 is a flow chart of an example process 400 for providing information to a network device using a hardware module mounted on a rack. In some implementations, one or more process blocks of FIG. 4 may be performed by hardware module 240. In some implementations, one or more process blocks of FIG. 4 may be performed by another device or a group of devices separate from or including hardware module 240, such as network device 210, printed circuit board 220, and/or storage device 230.

As shown in FIG. 4, process 400 may include providing a communication component to mate with a network device (block 410). For example, hardware module 240 may provide a male communication component or a female communication component that enables mating to a communication component associated with network device 210. In some implementations, hardware module 240 may provide the communication component for manual mating, such as by a network administrator, or for automatic mating, such as by a component of hardware module 240, as described below.

In some implementations, hardware module 240 may mate with network device 210 to enable communication between network device 210 and hardware module 240 (e.g., via a wired or wireless communication component, a contact or contactless communication component, etc.). For example, hardware module 240 may mate with network device 210 to enable network device 210 to obtain information stored by storage device 230. In some implementations, hardware module 240 may include a set of components used to communicate with network device 210. For example, the set of components may include a communication component to connect network device 210 with hardware module 240. As another example, the set of components may include printed circuit board 220 used to connect the communication component with storage device 230.

In some implementations, the communication component associated with network device 210 or hardware module 240 may include a communication component that enables communication between network device 210 and hardware module 240. For example, the communication component may include a bus used for communication, such as a one wire bus or a two wire bus. In some implementations, the communication component associated with network device 210 or hardware module 240 may include a male communication component. For example, the communication component may include a male pin communication component (e.g., a four-pin communication component or a 10-pin communication component). As another example, the communication component may include an RFID tag, a barcode tag, or a QR code tag. In some implementations, network device 210 or hardware module 240 may use the male communication component to mate with a female communication component associated with network device 210 or hardware module 240, as described below.

Additionally or alternatively, the communication component associated with network device 210 or hardware module 240 may include a female communication component. For example, the communication component may include a female pin communication component to mate with a male communication component associated with network device 210 or hardware module 240. As another example, the communication component associated with network device 210 or hardware module 240 may include a reader device (e.g., an RFID reader, a barcode reader, or a QR code reader) to read an RFID tag, a barcode tag, or a QR code tag presented by a male communication component associated with network device 210 or hardware module 240.

In some implementations, network device 210 or hardware module 240 may use the reader device to read an RFID tag, a barcode tag, or a QR code tag without a male communication component presenting the RFID tag, the barcode tag, or the QR code tag. For example, network device 210 may include a barcode reader to read a barcode attached to hardware module 240 or rack 250 upon being mounted on rack 250. This increases an efficiency of providing the information to network device 210 by reducing or eliminating the need for a mating component to present the RFID tag, the barcode tag, or the QR code tag.

As further shown in FIG. 4, process 400 may include mating with the network device using the communication component (block 420). For example, hardware module 240 may mate with network device 210 when a network administrator manually mates a communication component associated with hardware module 240 with a communication component associated with network device 210. As another example, hardware module 240 may mate with network device 210 by automatically mating a communication component associated with hardware module 240 with a communication component associated with network device 210. In some implementations, hardware module 240 may mate with network device 210 in association with network device 210 being mounted on rack 250.

In some implementations, hardware module 240 may use a mating component to mate the communication component associated with hardware module 240 and the communication component associated with network device 210. For example, hardware module 240 may use a spring loaded mating component or an electrically powered mating component to automatically mate hardware module 240 with network device 210. In some implementations, the mating component may automatically move the communication component associated with hardware module 240 into a mating position for mating with the communication component associated with network device 210. For example, the mating component may automatically move a male pin communication component so that the male pin communication component is mated with a female pin communication component of network device 210. As another example, the mating component may automatically move an RFID tag, a barcode tag, or a QR code tag within communicative proximity of a reader component of network device 210.

In this way, hardware module 240 may connect to network device 210 when network device 210 is mounted on rack 250, thereby increasing an efficiency of connecting hardware module 240 and network device 210 by reducing or eliminating the need for a network administrator to connect network device 210 and hardware module 240 prior to mounting network device 210 on rack 250.

As further shown in FIG. 4, process 400 may include receiving a request from the network device for information stored by a storage device (block 430). For example, hardware module 240 may receive a request from network device 210 for information stored by storage device 230, such as information that enables network device 210 to identify a physical location (e.g., a state, a city, a data center, a building, a floor, a room, a rack, or a rack unit of the rack) of network device 210. As another example, hardware module 240 may receive a request from network device 210 for information identifying network access credentials, such as a network access code, a username, or a password, to enable network device 210 to access network 260. In some implementations, hardware module 240 may receive the request in association with connecting to network device 210.

In some implementations, hardware module 240 may receive the request when network device 210 powers on or boots up. Additionally, or alternatively, hardware module 240 may receive the request when an application (e.g., an application installed on network device 210, executed on network device 210, or executed remotely by network device 210) requests the information. In some implementations, hardware module 240 may receive the request via the set of components. For example, hardware module 240 may receive the request from network device 210 via the communication component associated with hardware module 240, printed circuit board 220, and storage device 230.

As further shown in FIG. 4, process 400 may include providing the information based on receiving the request for the information (block 440). For example, hardware module 240 may provide the information from storage device 230 based on receiving the request for the information. In some implementations, hardware module 240 may provide the information via the set of components (e.g., from storage device 230 via printed circuit board 220, and the communication component associated with hardware module 240).

In some implementations, network device 210 may receive the information from hardware module 240 (e.g., via the communication component associated with network device 210 and a printed circuit board associated with network device 210). In some implementations, network device 210 may use memory resources to store the information in association with receiving the information. For example, network device 210 may store the information using local memory resources. As another example, network device 210 may store the information using memory resources remote to network device 210 (e.g., by providing the information to the remote memory resources via network 260).

In some implementations, network device 210 may use the information. For example, network device 210 may use the information to provide a service, such as a network management service or an inventory management service. Additionally, or alternatively, network device 210 may provide the information to an application or another device. For example, network device 210 may provide the information to enable the application or the other device to use the information.

In this way, hardware module 240 may mate with network device 210 to enable network device 210 to receive information from storage device 230 when network device 210 is mounted on rack 250. This increases an efficiency of providing the information to network device 210 by reducing or eliminating the need for network device 210 to be configured with the information prior to being mounted on the rack. In addition, the improves management of network device 210, when the information identifies a physical location of network device 210, by enabling network device 210 to obtain accurate location information when mounted on rack 250, removed from rack 250, or moved to a different rack unit of rack 250.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIGS. 5A-5G are diagrams of example implementations 500 relating to the example configuration shown in FIG. 2.

Figure 5A:
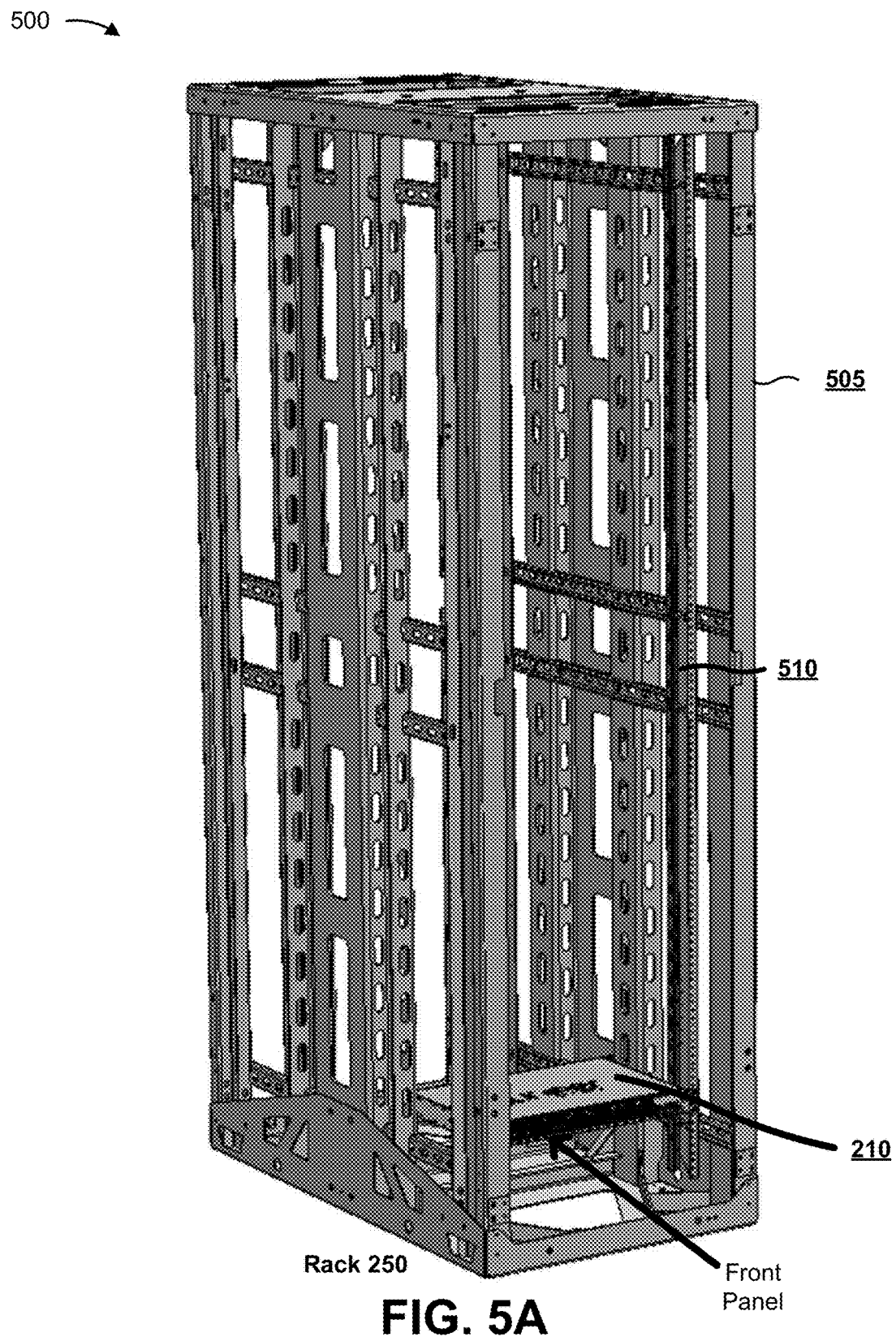
FIGS. 5A-5G are diagrams of an example implementation relating to the example configuration shown in FIG. 2.

As shown in FIG. 5A, rack 250 may include a rack post 505, on which components and/or devices may be mounted. As further shown in FIG. 5A, rack 250 may include a rail 510 mounted on rack post 505. In some implementations, rail 510 may be vertically mounted on rack post 505 of rail 510. For example, rail 510 may be mounted such that rail 510 extends vertically from a bottom portion of rack 250 to a top portion of rack 250. Additionally, or alternatively, rail 510 may be mounted so that at least a portion of rail 510 is within an interior portion of rack 250 (e.g., a portion of rack 250 where network device 210 is mounted on rack 250). Rail 510 is described in more detail below.

As further shown in FIG. 5A, network device 210 may be mounted on rack post 505. For example, network device 210 may be mounted on rack post 505 such that a portion of network device 210 is in contact with a portion of rail 510. Network device 210 and/or the mounting of network device 210 on rack post 505 is described in more detail below.

Figure 5B:
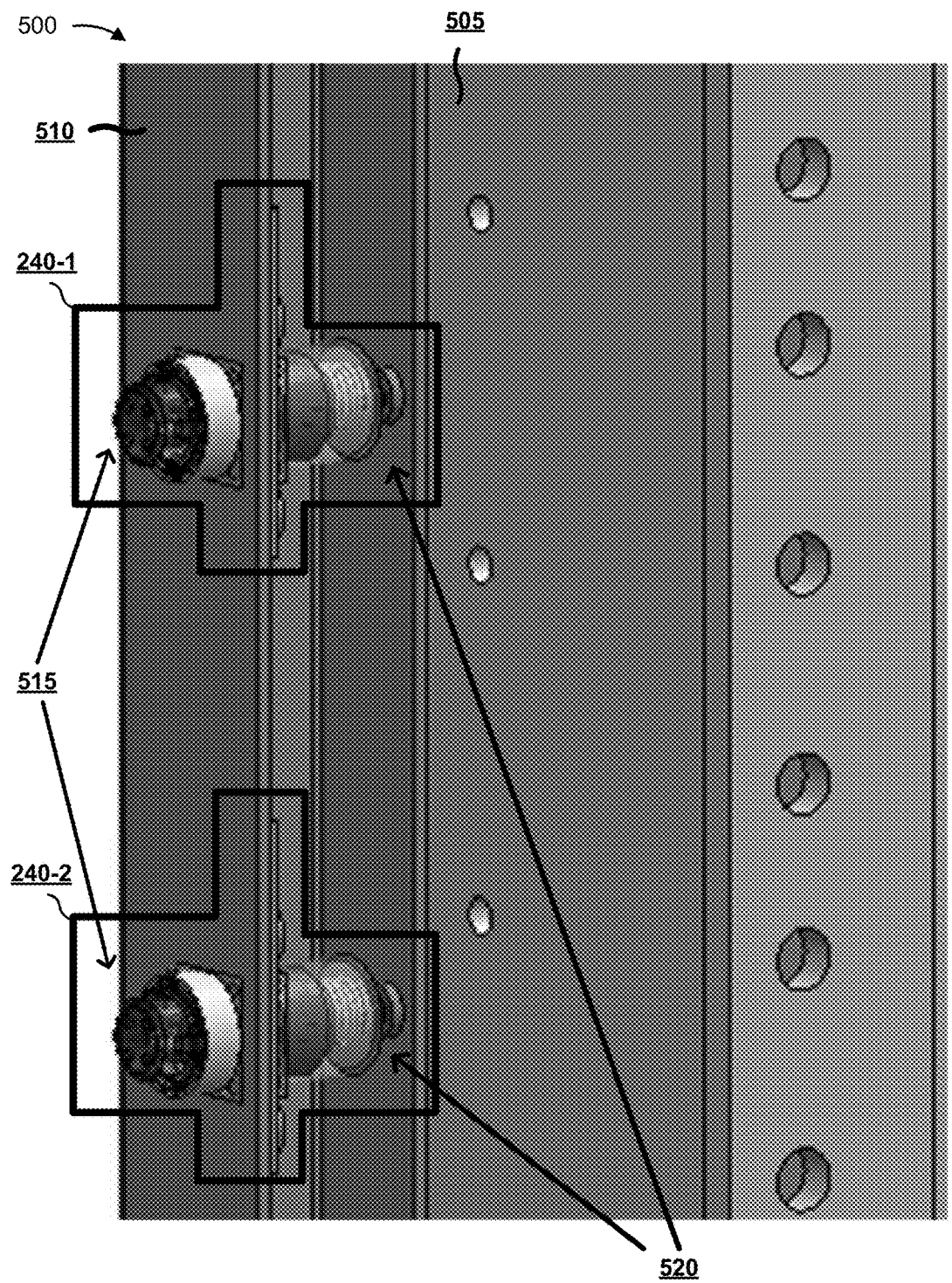

FIG. 5B shows a portion of rail 510 as mounted on rack post 505. As shown in FIG. 5B, rail 510 may include one or more hardware modules 240 (e.g., shown as hardware modules 240-1 and 240-2 mounted on rail 510). As further shown in FIG. 5B, hardware module 240 may include a mating end 515 (e.g., a first end, a front end, or a connecting end), where hardware module 240 connects to network device 210. As further shown, hardware module 240 may include a second end 520 (e.g., a non-mating end, a back end, or a non-connecting end) that is different from mating end 515 and that does not connect hardware module 240 to network device 210. Hardware module 240 and/or the manner by which hardware module 240 connects with network device 210 is described in more detail below. As further shown in FIG. 5B, rail 510 may include multiple hardware modules 240. In some implementations, the multiple hardware modules 240 may be mounted at a particular interval, such as one hardware module 240 per rack unit or one hardware module 240 per two rack units.

Figure 5C:
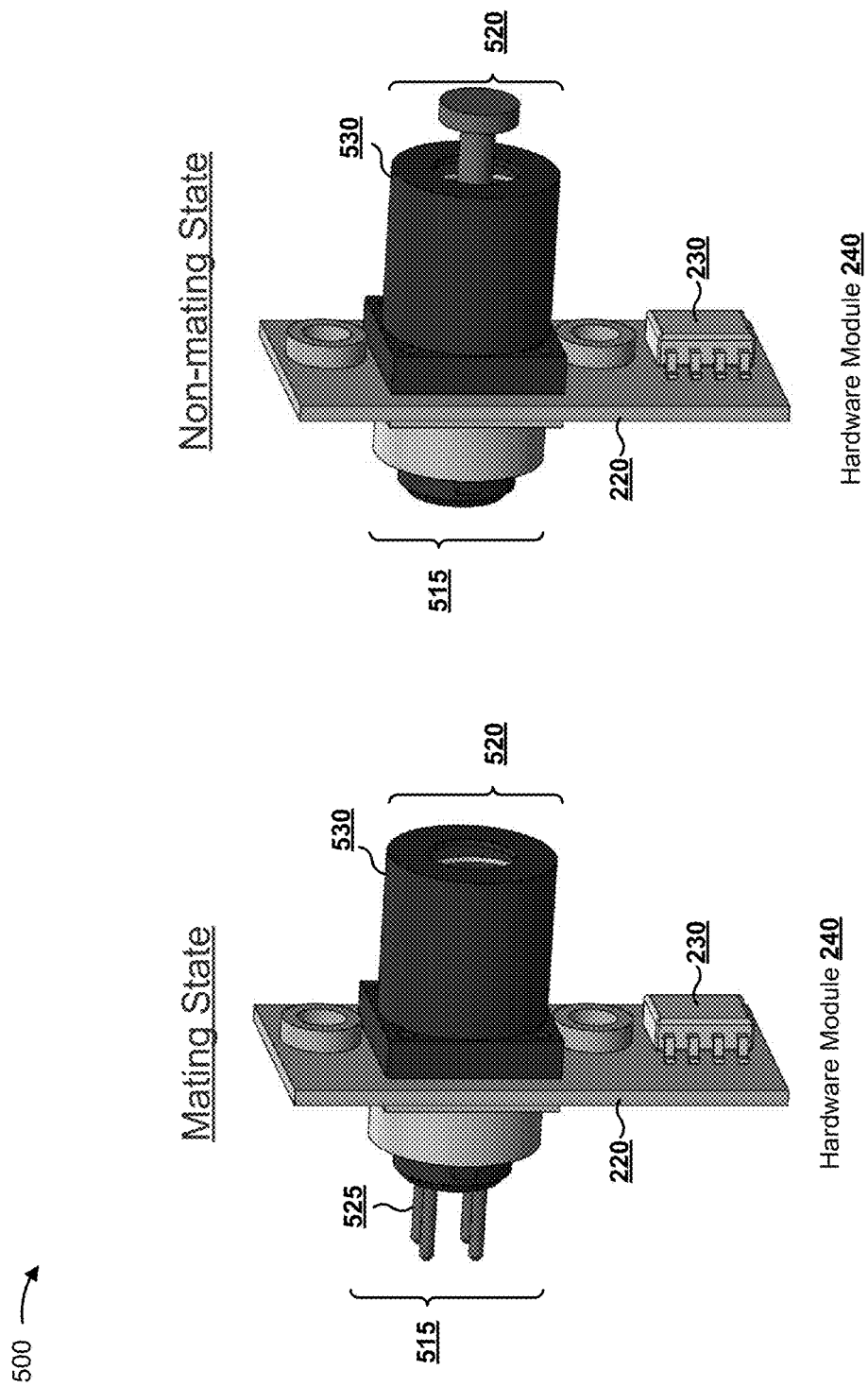

FIG. 5C shown an example implementation of hardware module 240. As shown in FIG. 5C, hardware module 240 may include one or more components. For example, hardware module 240 may include a communication component, such as male communication component 525 (e.g., shown as a 4-pin male communication component) that connects to a communication component associated with network device 210, as described below.

As another example, hardware module 240 may include printed circuit board 220 that connects to or includes storage device 230, thereby enabling network device 210 to read information from storage device 230 (e.g., via male communication component 525). As another example, hardware module 240 may include a housing 530, within which male communication component 525 may be retracted, as described in more detail below.

As further shown in FIG. 5C, hardware module 240 may have one or more states. For example, hardware module 240 may be in a mating state, where male communication component 525 is exposed for mating with network device 210 (e.g., via a female communication component associated with network device 210). As shown, in the mating state, male communication component 525 may not be retracted within housing 530. As another example, hardware module 240 may be in a non-mating state, where male communication component 525 is retracted within housing 530, thereby preventing mating between network device 210 and hardware module 240.

In some implementations, hardware module 240 may be in different states in different contexts. For example, hardware module 240 may be in the non-mating state prior to network device 210 being mounted on rack 250. As another example, hardware module 240 may be in the mating state, and mated with network device 210, when network device 210 is mounted on rack 250, thereby enabling network device 210 to read the information from storage device 230.

In some implementations, hardware module 240 may be in the non-mating state prior to initiation of the mounting of network device 210 (e.g., where male communication component 525 is in a locked retracted position within housing 530). This prevents male communication component 525 from obstructing the mounting of network device 210 by having male communication component 525 in a retracted position. In some implementations, hardware module 240 may switch from the non-mating state to the mating state based on manual interaction. For example, hardware module 240 may switch from the non-mating state to the mating state based on a network administrator interacting with hardware module 240 (e.g., interacting with a portion of housing 530 of hardware module 240).

Additionally, or alternatively, the mounting of network device 210 may cause hardware module 240 to automatically switch to the mating state. For example, physical contact between network device 210 and mating end 515 may cause a spring release mating component to automatically release male communication component 525 from the locked retracted position and to mate with a female communication component associated with network device 210. This enables male communication component 525 to automatically mate with network device 210, thereby improving an efficiency of mating network device 210 and hardware module 240 by reducing or eliminating the need for the network administrator to manually mate network device 210 and hardware module 240.

In some implementations, male communication component 525 may include a communication component other than a male pin communication component. For example, male communication component 525 may include an RFID tag, a barcode tag, or a QR code tag. Additionally, or alternatively, male communication component 525 may include a mating component to move the RFID tag, the barcode tag, or the QR code tag within communicative proximity of a reader component of network device 210. In this case, when hardware module 240 mates with network device 210, network device 210 may use a reader component to read the RFID tag, the barcode tag, or the QR code tag. Male communication component 525 is provided merely as an example. In some implementations, hardware module 240 may include a female communication component (e.g., rather than a male communication component).

In this way, hardware module 240 may include a communication component, one or more states, and/or a mating component for changing hardware module 240 from one state to another, thereby enabling mating of hardware module 240 and network device 210.

Figure 5D:
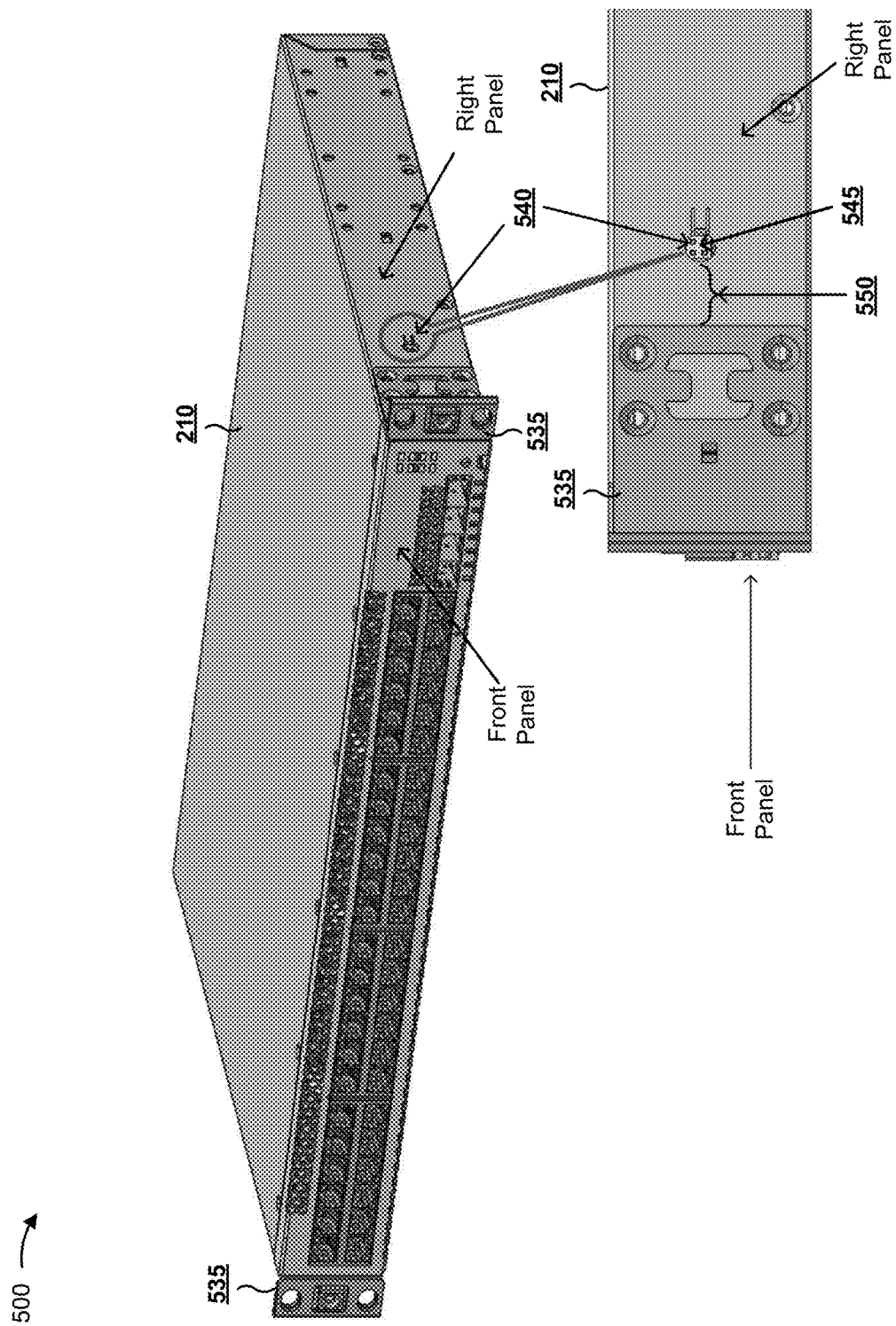

FIG. 5D shows an example implementation of an external configuration of network device 210. As shown in FIG. 5D, network device 210 may include one or more mounting brackets 535 for mounting network device 210 to rack 250 (e.g., by attaching mounting brackets 535 to rack post 505 using fasteners, such as screws, bolts, pins, rivets, etc.). As further shown in FIG. 5D, the housing of network device 210 may include an opening 540. For example, opening 540 may be included in a right panel of a housing of network device 210 (as shown in FIG. 5D). As another example, opening 540 may be included in a left panel of the housing of network device 210.

In some implementations, opening 540 may expose a communication component, such as female communication component 545 (e.g., shown as a 4-pin female communication component), thereby enabling mating of network device 210 and hardware module 240. Additionally, or alternatively, opening 540 may enable mating of network device 210 and another device, such as an EPROM programming device, while network device 210 is mounted on rack 250, as described below. Female communication component 545 is provided merely as an example. In some implementations, network device 210 may include a male communication component (e.g., rather than a female communication component).

As shown by reference number 550, mounting bracket 535 and opening 540 may be separated by a distance (e.g., a threshold distance or a standard distance), such that mounting bracket 535 does not obstruct opening 540. In some implementations, the distance may vary depending on a type of network device 210 (e.g., depending on whether network device 210 is a switch, a server, or a router). Separating mounting bracket 535 and opening 540 by this distance ensures that hardware module 240 can mate with network device 210 by ensuring that female communication component 545 is unobstructed. In some implementations, rail 510 may be mounted on rack 250 based on the distance that separates mounting bracket 535 and opening 540, thereby ensuring that male communication component 525 and female communication component 545 are aligned.

In some implementations, mounting bracket 535 may include printed circuit board 220, storage device 230, and male communication component 525. For example, printed circuit board 220, storage device 230, and male communication component 525 may be mounted on mounting bracket 535 (e.g., rather than on rail 510). In this case, mounting bracket 535 may mate with female communication component 545 via male communication component 525 when mounting bracket 535 is attached to network device 210. This enables the network administrator to mate mounting bracket 535 and network device 210, thereby reducing or eliminating the need for the network administrator to customize rack 250 with rail 510 prior to mounting network device 210 on rack 250. In some implementations, when mounting bracket 535 includes printed circuit board 220, storage device 230, and male communication component 525, mounting bracket 535 may obstruct opening 540 when mounted on network device 210.

Figure 5E:
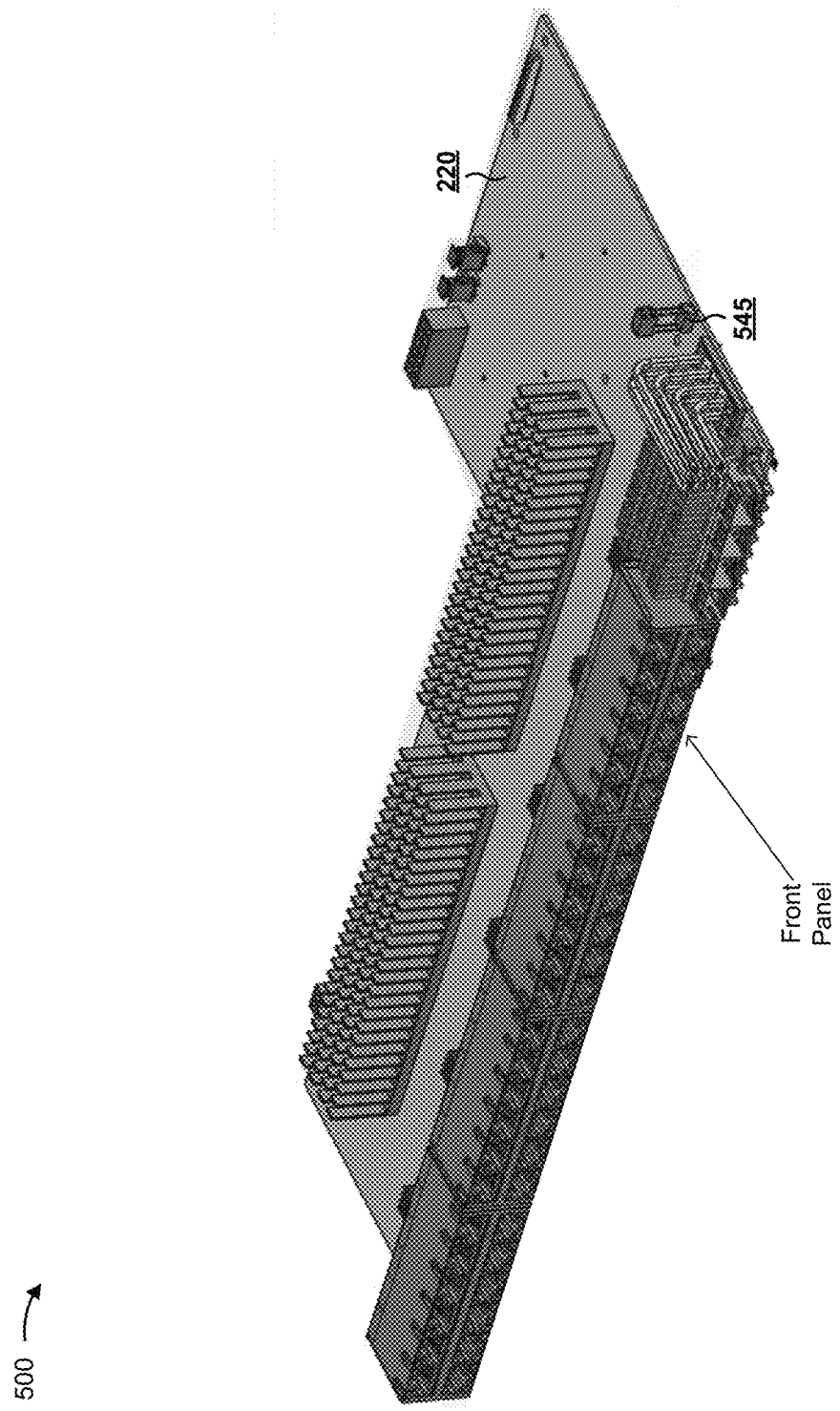

FIG. 5E shows an example configuration of internal components of network device 210. As shown in FIG. 5E, female communication component 545 may be connected with printed circuit board 220. This enables network device 210 to communicate with hardware module 240 when network device 210 and hardware module 240 are mated via male communication component 525 and female communication component 545. In addition, this enables network device 210 to store the information using memory resources connected with printed circuit board 220 upon receipt of the information from storage device 230.

Figure 5F:
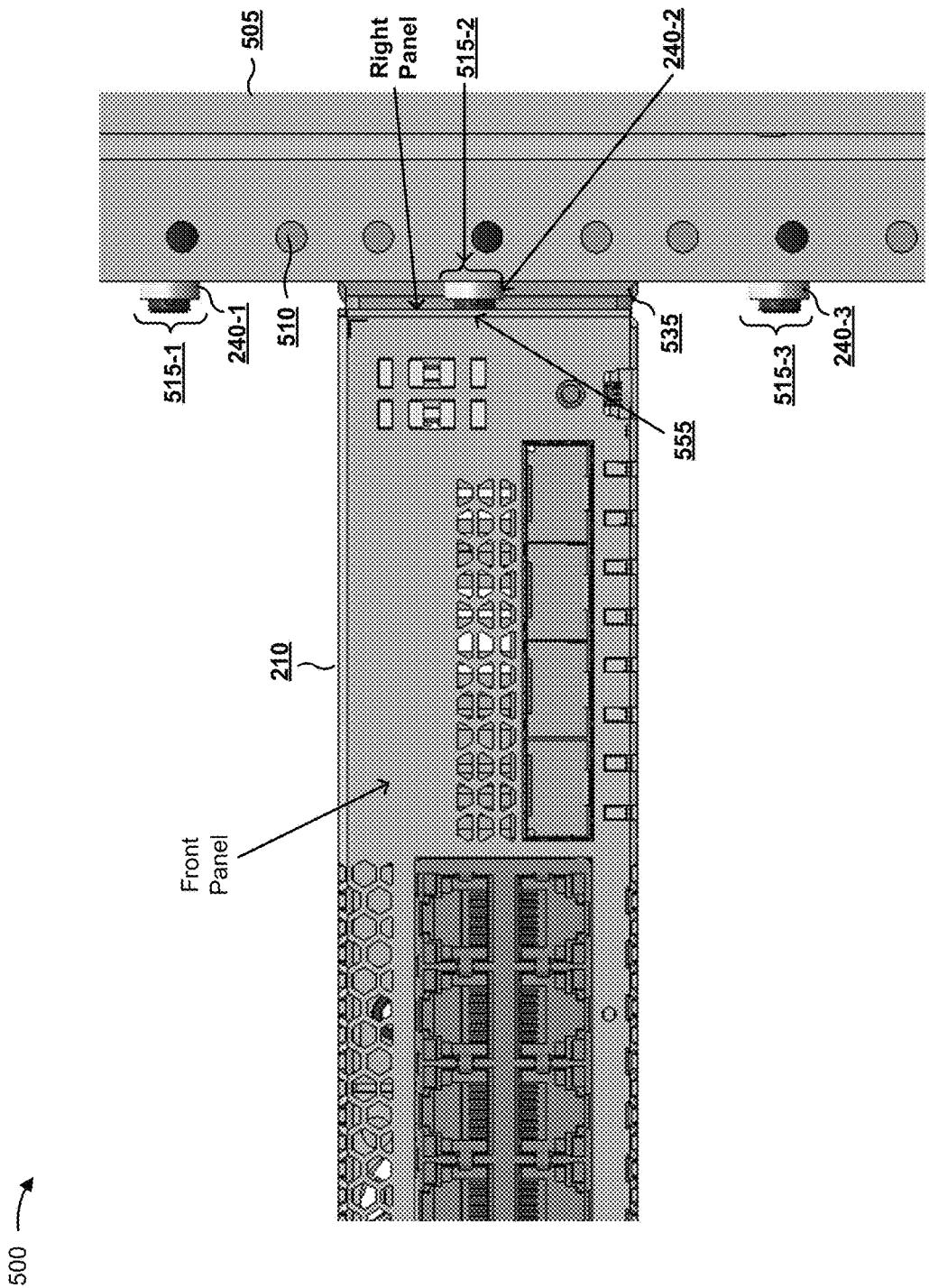

FIG. 5F shows an example implementation of network device 210 mounted on rail 510. As shown in FIG. 5F, network device 210 may be mounted on rail 510 of rack post 505. For example, network device 210 may be mounted on rail 510 of rack post 505 using mounting bracket 535. As further shown in FIG. 5F, and by reference number 555, network device 210 and hardware module 240-2 may be mated (e.g., at mating end 515-2 of hardware module 240-2). For example, hardware module 240-2 may be in the mating state, with male communication component 525 of hardware module 240-2 mated with female communication component 545 of network device 210. As further shown in FIG. 5F, hardware modules 240-1 and 240-3 may be in the non-mating state based on network device 210 not being mounted at the rack units associated with hardware modules 240-1 and 240-3.

Figure 5G:
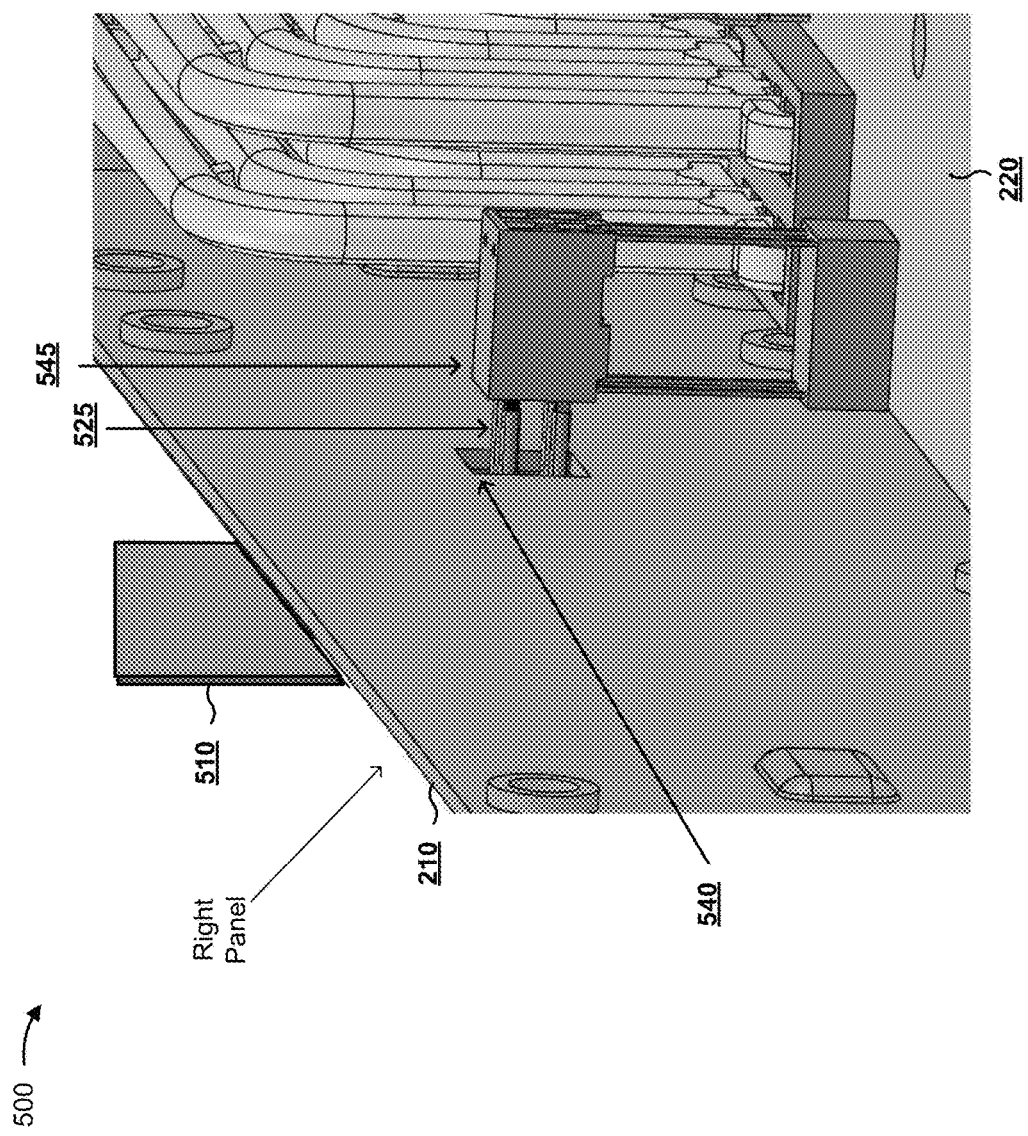

FIG. 5G shows the mating between network device 210 and hardware module 240 from an interior view of network device 210. As shown in FIG. 5G, male communication component 525 and female communication component 545 may be mated or in the process of being mated. As further shown in FIG. 5G, the mating of male communication component 525 and female communication component 545 may occur when network device 210 is mounted on rail 510.

As indicated above, FIGS. 5A-5G are provided merely as an example. Other examples are possible and may differ from what was described with regard to FIGS. 5A-5G.

Figure 6:
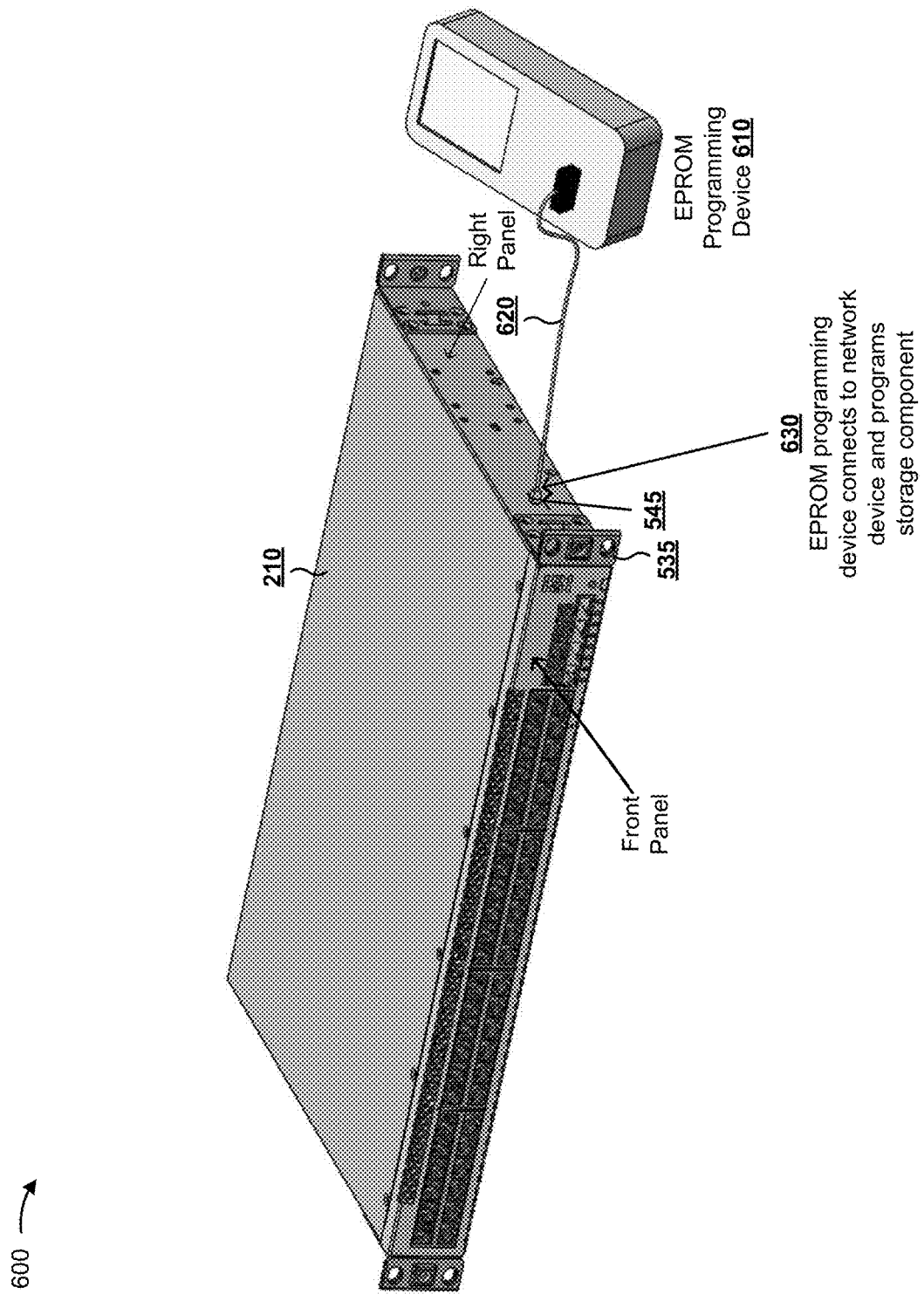
FIG. 6 is a diagram of an example implementation described herein.

FIG. 6 is a diagram of an example implementation 600 described herein. Assume for FIG. 6 that rack 250 lacks hardware modules 240. Further assume, for example, that network device 210 includes storage device 230 and that storage device 230 is an EPROM component. As shown in FIG. 6, EPROM programming device 610 may be connected to network device 210 via a wired connection 620. As further shown in FIG. 6, EPROM programming device 610 may be connected with network device 210 via female communication component 545. As shown by reference number 630, EPROM programming device 610 may provide the information to network device 210 (e.g., by providing the information to storage device 230 included in network device 210). In some implementations, EPROM programming device 610 may configure network device 210 while network device 210 is mounted on rack 250. In this way, a device may configure network device 210, such as when rack 250 is not configured with rail 510 and/or hardware modules 240.

As indicated above, FIG. 6 is provided merely as an example. Other examples are possible and may differ from what was described with regard to FIG. 6.

Implementations described herein enable a network administrator to configure components of a rack to enable a network device to receive information upon being mounted on the rack. This increases an efficiency of providing the information to the network device by reducing or eliminating the need for the network device to wait to receive the information. In addition, this reduces or eliminates the effort of, or need for, the network operator to configure the network device, thereby increasing an efficiency of providing the information to the network device.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A rack, comprising:
  a rail mounted on the rack;
  multiple hardware modules mounted on the rail,
    the multiple hardware modules being mounted on the rail at an interval,
    each hardware module of the multiple hardware modules configured to mate with a corresponding network device,
    each hardware module of the multiple hardware modules including:
      a storage device that stores information to be transmitted to the corresponding network device associated with a respective hardware module, based on the corresponding network device being mounted on the rack,
      a communication component that permits the information to be communicated from the storage device to the corresponding network device associated with the respective hardware module based on the corresponding network device being mounted on the rack to allow the corresponding network device to identify a physical location of the corresponding network device,
      one or more processors to:
        receive a request from the corresponding network device for the information stored by the storage device,
          the request identifying network credentials,
          the request being received in association with the respective hardware module connecting to the corresponding network device, and
        provide the information to the corresponding network device based on receiving the request from the corresponding network device;
      a mating component configured to mate the communication component and the corresponding network device; and
      a housing,
        wherein the respective hardware module is configured to be placed into one of one or more states including:
          a mating state wherein the mating component is extended from the housing for mating with the corresponding network device, and
          a non-mating state wherein the mating component is retracted within the housing, and
        wherein the respective hardware module is further configured to, when the corresponding network device is mounted on the rack, automatically switch to the mating state and automatically communicate the information to the corresponding network device.

2. The rack of claim 1, where each hardware module further includes:
  a printed circuit board that permits the storage device to transmit the information to the communication component for communicating to the corresponding network device associated with the respective hardware module.

3. The rack of claim 1, where the storage device includes:
  an erasable programmable read-only memory (EPROM) component,
  an electrically erasable programmable read-only memory (EEPROM) component,
  a flash memory component, or
  a physical storage device.

4. The rack of claim 1, where the storage device includes:
  a radio-frequency identification (RFID) tag,
  a quick response (QR) code tag,
  a barcode tag, or
  an optical storage device.

5. The rack of claim 1, where the information includes information associated with identifying a physical location of the corresponding network device.

6. The rack of claim 1, where the mating component is spring loaded.

7. The rack of claim 1, where the mating component is electrically powered.

8. The rack of claim 1, where, when receiving the request from the corresponding network device for the information stored by the storage device, the one or more processors are to at least one of:
   receive the request when the corresponding network device powers on; or
   receive the request when the corresponding network device boots up.

9. The rack of claim 1, where the request from the corresponding network device for the information stored by the storage device includes a request for information identifying one or more access credentials.

10. The rack of claim 1, where the housing further comprises:
    an opening to enable the respective hardware module to mate with the corresponding network device.

11. Multiple hardware modules configured to be mounted on a rail of a rack,
    the multiple hardware modules being mounted on the rail at an interval,
        each hardware module of the multiple hardware modules configured to mate with a corresponding network device,
        each hardware module of the multiple hardware modules comprising:
            a communication component capable of mating the hardware module to the corresponding network device associated with a respective hardware module when the corresponding network device is mounted on the rack to allow the corresponding network device to identify a physical location of the corresponding network device;
            a storage device connected to the communication component,
                the storage device storing information to be transmitted to the corresponding network device associated with the respective hardware module, via the communication component, when the corresponding network device is mounted on the rack;
            one or more processors to:
                receive a request from the corresponding network device for the information stored by the storage device,
                    the request identifying network credentials,
                    the request being received in association with the respective hardware module connecting to the corresponding network device and
                provide the information to the corresponding network device based on receiving the request from the corresponding network device;
            a mating component configured to mate the communication component and the corresponding network device; and
            a housing,
                wherein the respective hardware module is configured to be placed into one of one or more states including:
                    a mating state wherein the mating component is extended from the housing for mating with the corresponding network device, and
                    a non-mating state wherein the mating component is retracted within the housing, and
                wherein the respective hardware module is further configured to, when the corresponding network device is mounted on the rack, automatically switch to the mating state and automatically communicate the information to the corresponding network device.

12. The hardware module of claim 11, where the communication component includes:
    a male pin communication component,
    a female pin communication component,
    a radio-frequency identification (RFID) tag,
    a quick response (QR) code tag,
    a barcode tag,
    a wired communication component,
    a wireless communication component,
    a contact communication component, or
    a contactless communication component.

13. The hardware module of claim 11, where the mating component is spring loaded.

14. The hardware module of claim 11, where the mating component is electrically powered.

15. The hardware module of claim 11, where the request from the corresponding network device for the information stored by the storage device includes a request for information identifying one or more access credentials.

16. An apparatus configured to be mounted on a rail of a rack, the apparatus comprising:
    multiple hardware modules mounted on the rail at an interval,
        each hardware module of the multiple hardware modules configured to mate with a corresponding network device,
        each hardware module of the multiple hardware modules including;
            a communication component for communicating with the corresponding network device associated with a respective hardware module when the corresponding network device is mounted on the rail of the rack,
                the communication component to allow the corresponding network device to identify a physical location of the corresponding network device;
            a storage device for storing information to be provided to the corresponding network device associated with the respective hardware module, via the communication component, when the corresponding network device is mounted on the rail of the rack;
            one or more processors to:
                receive a request from the corresponding network device for the information stored by the storage device,
                    the request identifying network credentials,
                    the request being received in association with the respective hardware module connecting to the corresponding network device and
                provide the information to the corresponding network device based on receiving the request from the corresponding network device;
        a mating component configured to mate the communication component and the corresponding network device; and
        a housing,
            wherein respective hardware module is configured to be placed into one of one or more states including:

a mating state wherein the mating component is extended from the housing for mating with the corresponding network device, and a non-mating state wherein the mating component is retracted within the housing, and wherein the respective hardware module is further configured to, when the corresponding network device is mounted on the rack, automatically switch to the mating state and automatically communicate the information to the corresponding network device.

17. The apparatus of claim 16, where the apparatus is included in the corresponding network device.

18. The apparatus of claim 16, where the mating component is spring powered.

19. The apparatus of claim 16, where the mating component is electrically powered.

20. The apparatus of claim 16, where the request from the corresponding network device for the information stored by the storage device includes a request for information identifying one or more access credentials.

21. The apparatus of claim 16, where the housing further comprises:

an opening to enable the respective hardware module to mate with the corresponding network device.

* * * * *